United States Patent
Narayan et al.

(10) Patent No.: US 8,183,921 B1
(45) Date of Patent: May 22, 2012

(54) OFFSET CANCELLATION FOR CONTINUOUS-TIME CIRCUITS

(75) Inventors: Sriram Narayan, Pleasanton, CA (US); Xiaoyan Su, San Jose, CA (US); Sergey Shumarayev, Los Altos Hills, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 12/954,090

(22) Filed: Nov. 24, 2010

(51) Int. Cl.
*H03F 3/45* (2006.01)
(52) U.S. Cl. .......................... 330/259; 330/9
(58) Field of Classification Search .............. 330/9, 98, 330/150, 259, 310
See application file for complete search history.

(56) References Cited

U.S. PATENT DOCUMENTS

| | | | | |
|---|---|---|---|---|
| 3,733,558 A | * | 5/1973 | Cramer et al. ............... 330/259 |
| 4,973,919 A | | 11/1990 | Allfather | |
| 5,594,387 A | * | 1/1997 | Kagawa ....................... 330/259 |
| 5,798,664 A | * | 8/1998 | Nagahori et al. ............ 327/307 |
| 5,838,197 A | * | 11/1998 | Tsukuda ....................... 330/252 |
| 7,321,259 B1 | | 1/2008 | Shumarayev | |
| 7,541,857 B1 | | 6/2009 | Wong et al. | |
| 7,586,983 B1 | | 9/2009 | Shumarayev et al. | |
| 7,636,003 B2 | * | 12/2009 | Liu et al. .................... 327/307 |
| 7,710,180 B1 | | 5/2010 | Lai et al. | |
| 7,804,892 B1 | | 9/2010 | Shumarayev et al. | |
| 2009/0279597 A1 | | 11/2009 | Bereza et al. | |
| 2010/0164618 A1 | | 7/2010 | Tiiliharju | |

* cited by examiner

*Primary Examiner* — Henry Choe
(74) *Attorney, Agent, or Firm* — Okamoto & Benedicto LLP

(57) ABSTRACT

One embodiment relates to a continuous-time circuit configured with an offset cancellation loop. The continuous-time circuit includes a multi-stage amplifier chain, including a first amplifier stage and a last amplifier stage, and an offset cancellation loop. The offset cancellation loop is configured to receive an output of the last amplifier stage and to provide an offset correction voltage signal to the first amplifier stage. The offset compensation loop may create one dominant pole and a single consequential parasitic pole so as to have greater stability and may advantageously achieve a second-order roll-off in response magnitude at higher frequencies. Other embodiments, aspects, and features are also disclosed.

20 Claims, 8 Drawing Sheets

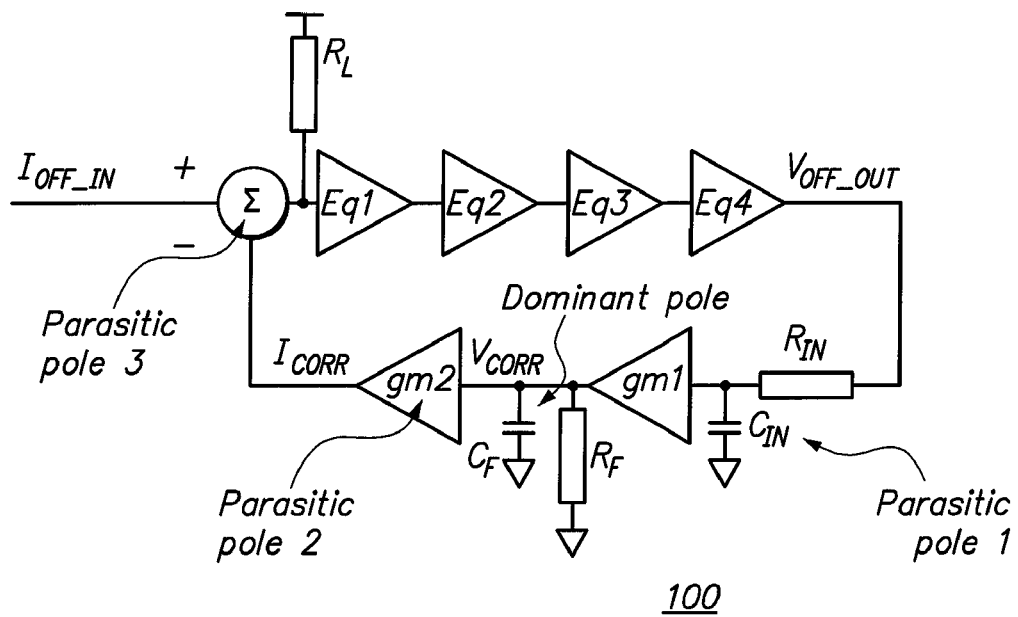
FIG. 1
*(Conventional)*
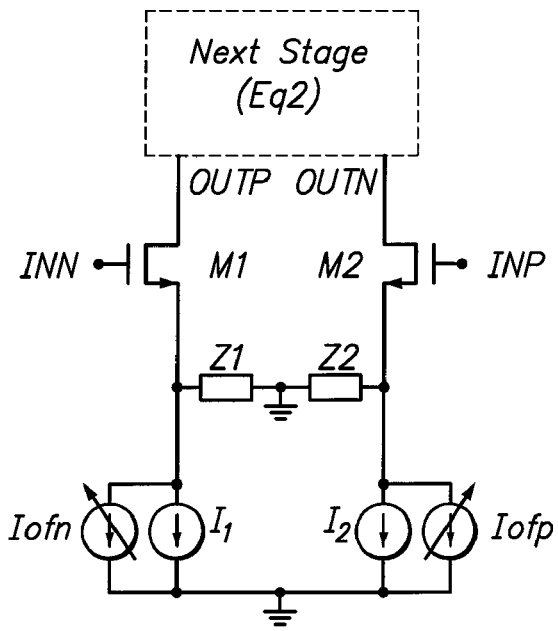
FIG. 2
*(Conventional)*

OFFSET CANCELLATION FOR CONTINUOUS-TIME CIRCUITS

BACKGROUND

1. Technical Field

The present invention relates generally to electrical circuits. More particularly, the present invention relates to offset cancellation for continuous-time circuits.

2. Description of the Background Art

A high speed serial interface ("HSSI") may be used to communicate between devices in a system. Typically, it is the intention for the transmitter in such a system to transmit a digital (binary) signal having two distinctive levels, and well-defined (i.e., very steep) transitions from either of these levels to the other level. Such steep transitions are essential to transmitting data at high speed. The medium that conveys the signal from the transmitter to the receiver usually imposes losses on the signal being transmitted. These losses generally include diminished signal amplitude and reduced transition steepness.

To maintain accurate, high-speed data transmission, it is necessary for the circuitry to compensate for these losses. One compensation technique is to use what is called equalization at the receiver. Equalization circuitry is typically among the first circuitry that the incoming signal sees when it reaches the receiver. Equalization circuitry may be designed to amplify higher frequencies so as to respond strongly and rapidly to transitions detected in the received signal. This strong and rapid response is intended to restore the original steepness to these transitions, thereby making it possible for further circuitry of the receiver to correctly interpret the signal, even at the very high data rate of that signal.

It is highly desirable to improve equalizers and other continuous-time circuits for high-speed serial interfaces and other applications.

SUMMARY

One embodiment relates to a continuous-time circuit configured with an offset cancellation loop. The continuous-time circuit includes a multi-stage amplifier chain, including a first amplifier stage and a last amplifier stage, and an offset cancellation loop. The offset cancellation loop is configured to receive an output of the last amplifier stage and to provide an offset correction voltage signal to the first amplifier stage.

The first amplifier stage may include an input transistor and an offset compensation transistor. The drain of the offset compensation transistor may be electrically connected to the source of the input transistor, and a voltage on the gate of the offset compensation transistor may be determined by the offset correction voltage signal. The offset correction voltage signal may be generated using a single transconductance amplifier. The offset compensation loop may create one dominant pole and a single consequential parasitic pole so as to have greater stability and may advantageously achieve a second-order roll-off in response magnitude at higher frequencies. The multi-stage amplifier chain may comprise a multi-stage equalizer chain.

Another embodiment relates to a method of offset cancellation for a continuous-time circuit. A continuous-time input signal is received and amplified by a series of amplifier stages so as to generate a continuous-time output signal. The continuous-time output signal is input into an offset cancellation loop, and the offset cancellation loop generates an offset correction voltage signal. The offset correction voltage signal is applied to a gate of an offset compensation transistor in an amplifier stage.

Another embodiment relates to an integrated circuit that includes a cascaded circuit having multiple equalizer stages, including a first equalizer stage and a last equalizer stage, and an offset cancellation loop. The first equalizer stage is configured to receive a differential input signal, and the last equalizer stage is configured to output a differential output signal. The offset cancellation loop is configured to receive the differential output signal and to generate a differential offset correction voltage signal which is applied within the first equalizer stage. The first equalizer stage includes at least a pair of input transistors, a pair of offset compensation transistors, and a pair of resistors. The gates of the input transistors are configured to receive the differential input signal. The drain of each offset compensation transistor is electrically connected to a source of a corresponding input transistor, and voltages applied to the gates of the offset compensation transistors are determined by the differential offset correction voltage signal. Each said resistor is configured in parallel with a channel of a corresponding offset compensation transistor.

Other embodiments, aspects and features are also disclosed.

BRIEF DESCRIPTION OF THE DRAWINGS

FIG. 1 shows a conventional circuit for offset cancellation of a continuous-time circuit.

FIG. 2 is a circuit diagram depicting the conventional technique for applying of an offset cancellation loop signal to a first equalizer stage.

DETAILED DESCRIPTION

Figure 3:
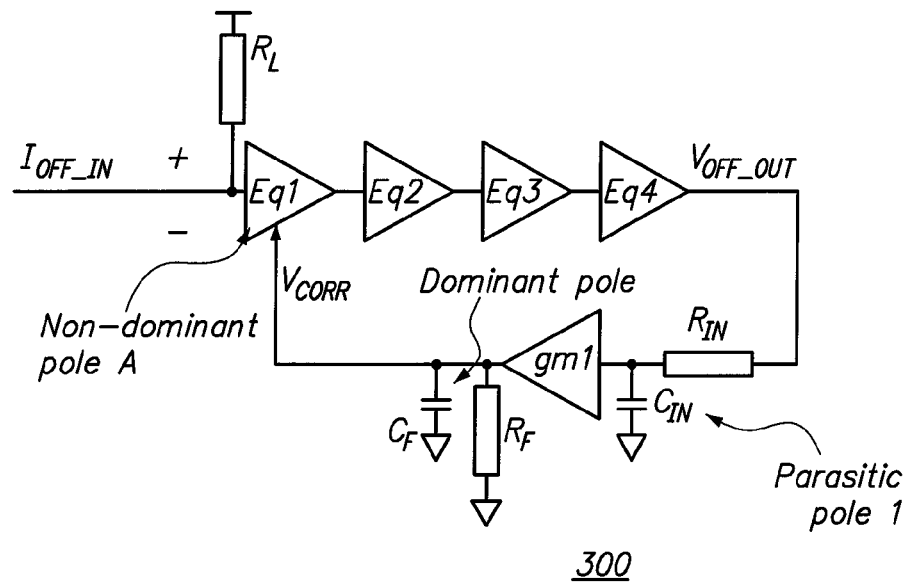
FIG. 3 shows a circuit for offset cancellation of a continuous-time circuit in accordance with an embodiment of the invention.

For the purposes of discussion and not limitation, it is generally assumed that the cascaded circuits described below receive (and output) data signals that are differential signals. However, it should be appreciated that principles of the presently-disclosed invention may also apply to single-ended signals.

Conventional continuous-time cascaded circuits typically employ a feedback loop that filters an output offset voltage, pass it though a high-gain amplifier, and apply a feedback current to the first stage of the circuit to reduce the offset in a continuous time manner. Such a conventional continuous-time cascaded circuit with a feedback loop is shown in FIG. 1. Note that continuous-time circuits operate on continuous-time signals, as opposed to sampled discrete-time signals.

In the example circuit 100 shown in FIG. 1, four equalizer stages (Eq1, Eq2, Eq3, and Eq4) are cascaded in a serial chain. The first equalizer stage (Eq1) has an input load ($R_L$) and receives an input current which is equal to an offset input current ($I_{OFF\_IN}$) minus a correction current ($I_{CORR}$). Eq1 may be configured to amplify higher frequencies so as to increase the steepness of transitions in the input current.

The output of Eq1 is connected to the input of the second equalizer stage (Eq2). The output of Eq2 is connected to the input of the third equalizer stage (Eq3). Finally, the output of Eq3 is connected to the input of the fourth equalizer stage (Eq4). Each of these further stages (Eq2, Eq3, and Eq4) may be configured to further increase steepness to the detected transition or otherwise shape the signal.

As further seen in FIG. 1, a first transconductance amplifier (gm1) drives a feedback load, represented by capacitor $C_F$ and resistor $R_F$, which realizes the dominant pole (Dominant pole) of this feedback loop. Other components in the loop contribute parasitic poles which affect the phase margin of this entire loop.

In the feedback loop of FIG. 1, there is one dominant pole (Dominant pole) and three non-trivial parasitic poles. A first parasitic pole (Parasitic pole 1) is due to the low-pass filter, represented by resistor $R_{IN}$ and capacitor $C_{IN}$, at the input of gm1 (i.e. at the input of the offset compensation loop). A second parasitic pole (Parasitic pole 2) is due to a second transconductance amplifier (gm2) which has an input signal ($V_{CORR}$) driven by gm1 and which provides the correction current ($I_{CORR}$) as its output. The third parasitic pole (Parasitic pole 3) is due to the effective current summation ($\Sigma$) which occurs as the offset cancellation loop signal ($I_{CORR}$) is applied to the input of the first equalizer stage (Eq1).

A conventional circuit implementation of a first equalizer stage showing the application of the offset cancellation loop signal is shown in FIG. 2. As shown, the first equalizer stage may include a pair of differential transistors (M1 and M2), impedances (Z1 and Z2), with a virtual ground in between the impedances), and tail current sources (I1 and I2). In this conventional circuit, the offset cancellation loop signal ($I_{CORR}$) is applied by the differential current output of gm2 (shown as the variable current sources Iofn and Iofp, where $I_{CORR}$=Iofp−Iofn being fed in parallel to the tail current sources (I1 and I2, respectively). The differential output (OUTP and OUTN) of this first stage is provided as the differential input of the next stage (Eq2).

As discussed above, the conventional technique for offset cancellation in continuous-time circuits injects current into the compensated stage using a feedback filtered voltage. Applicants have determined, however, that stabilization of the conventional circuit can be problematic, especially for high gain loops. Applicants believe that the instability of the conventional circuit is due, at least in part, to the presence of the multiple parasitic poles.

In comparison with the conventional offset cancellation circuit 100 described above, the offset cancellation circuit 300 disclosed herein provides the following benefits and advantages. First, the offset cancellation signal may be kept in the voltage domain throughout, rather than needing to change it to the current domain. Second, the second transconductance amplifier (gm2) may be advantageously eliminated. Third, the number of non-trivial parasitic poles in the feedback path is reduced from three to two, and the reduced number of poles increases the stability of the circuit. Fourth, by controlling the switch resistance directly, a smaller overall loop gain may be used to compensate a same amount of offset. In other words, the range of offset may be larger than in the conventional approach. This is because the compensating switch resistance is varied, not the current in the tail current source. Finally, the offset current is not wasted, as in the case of a pseudo differential stage.

FIG. 3 shows a circuit 300 for offset cancellation of a continuous-time circuit in accordance with an embodiment of the invention. In the particular embodiment depicted in FIG. 3, four equalizer stages (Eq1, Eq2, Eq3, and Eq4) are cascaded in a serial chain. Other embodiments may have a different number of stages and/or may have cascaded amplifier (rather than equalizer) stages.

The first equalizer stage (Eq1) receives an input current which is equal to an offset input current ($I_{OFF\_IN}$). In contrast to the conventional circuit in FIG. 1, there is no effective current summation ($\Sigma$) with a correction current ($I_{CORR}$) generated by gm2. Instead, the correction voltage ($V_{CORR}$) output by gm1 (in combination with the feedback load represented by $C_F$ and $R_F$) is sent directly to the first stage (without the need for gm2).

In the feedback loop of FIG. 3, there is one dominant pole (Dominant pole) and only two non-trivial parasitic poles. The first parasitic pole (Parasitic pole 1) is due to the low-pass filter, represented by resistor $R_{IN}$ and capacitor $C_{IN}$, at the input of gm1. The second parasitic pole (Parasitic pole A) is due to the first equalizer stage (Eq1) and, as discussed below, may be neglected for phase margin analysis. Hence, in comparison to FIG. 1, two detrimental parasitic poles have been eliminated in the feedback path of FIG. 3.

Figure 4:
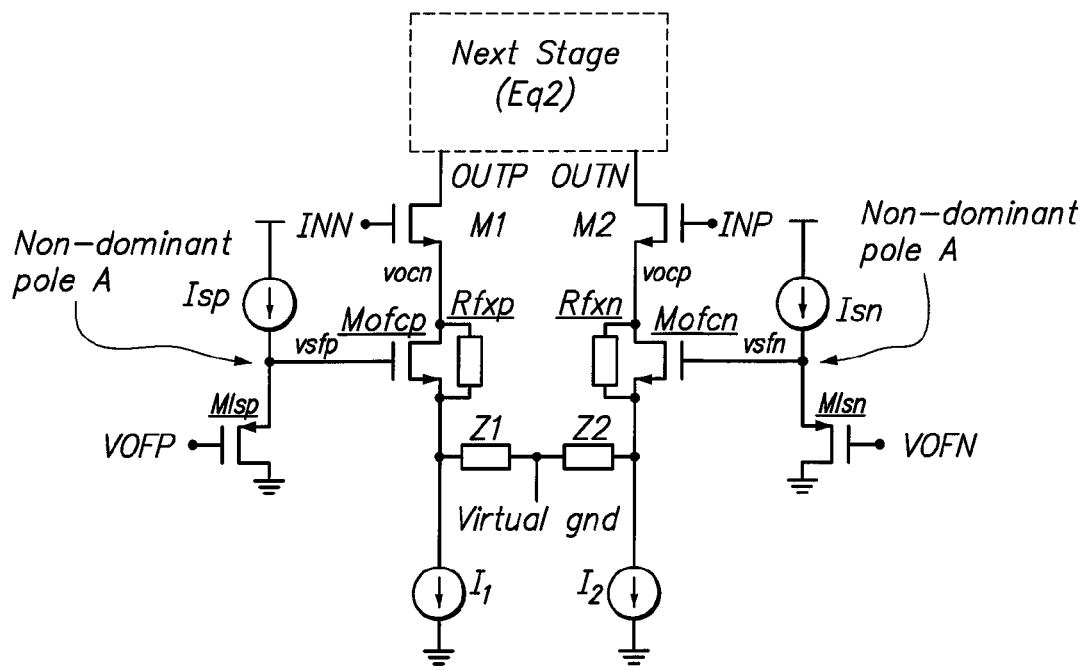
FIG. 4 is a circuit diagram depicting the application of an offset cancellation loop signal to a first equalizer/amplifier stage in accordance with an embodiment of the invention.

FIG. 4 depicts a circuit implementation of a first equalizer stage (Eq 1 in FIG. 3) showing the application of the offset cancellation loop voltage in accordance with an embodiment of the invention. As described below, this control voltage may be used to cancel the offset of the cascaded equalizer chain.

As shown, the first equalizer stage may include a pair of differential transistors (M1 and M2), a pair of offset input transistors (Mlsp and Mlsn), a pair of offset compensation transistors (Mofcp and Mofcn). The stage also includes impedances (Z1 and Z2), with a virtual ground therebetween), resistors (Rfxp and Rfxn), and current sources (I1, I2, Isp and Isn). In this particular implementation, M1 and M2 may be NMOS transistors with gate width/length of Win/Lin, Mlsp and Mlsn may be PMOS transistors with gate width/length W1/L1, and Mofcp and Mofcn may be NMOS transistors with gate width/length W2/L2.

In this circuit, the voltage output ($V_{CORR}$) of the transconductance amplifier/low pass filter combination in FIG. 3 is input to the first stage directly as differential offset voltage inputs VOFP and VOFN, where $V_{CORR}$=VOFP−VOFN. As seen in FIG. 4, the differential offset voltage inputs (VOFP and VOFN) are buffered by source follower circuits (comprising current source Isp and transistor Mlsp, and current source Isn and transistor Mlsn, respectively). The buffered differential voltage inputs (vsfp and vsfn) are applied to the gates of the offset compensation transistors (Mofcp and Mofcn, respectively) which are operating in the "linear" region. Note that, as the gate voltage on an NMOS transistor (such as, Mofcp or Mofcn) in the linear region increases, its channel resistance drops. On the other hand, as the gate voltage on an NMOS transistor in the linear region decreases, its channel resistance increases.

During offset compensation, a differential voltage is developed by the feedback loop as VOFP rises and VOFN falls (and vice-versa) in response to a DC (direct current) offset in the chain. The bleed resistors (Rfxp and Rfxn) allow some of the current to bypass Mofcp and Mofcn.

In this circuit, the amplitude of the correctable offset voltage is determined, in part, by the ratio of resistance between Rfxp and Mofcp (and between Rfxn and Mofcn). The amplitude of the correctable offset voltage increases if more of the current is modulated by Mofcp and Mofcn. However, Mofcp and Mofcn also act as additional source degeneration resistors that degrade the effective gain of the input pair (M1 and M2) and so reduces the bandwidth and gain of the stage, i.e. decreases the AC (alternating current) performance of the stage. By selecting an appropriate resistance ratio, a practical compromise between offset cancellation and the performance of the equalization stage may be achieved.

On one extreme, if Rfxp and Rfxn are removed (i.e. set to infinity or open circuit), then all the current flows through, and is modulated by, Mofcp and Mofcn. In that case, the maximum achievable correctable offset voltage is reached, but the AC performance of the equalization stage is at a minimum. The maximum achievable correctable offset voltage is determined, at least in part, by the product of the tail current (i.e. $I_1$ and $I_2$) and the range of the variable channel resistance of offset compensation transistor (i.e. the channel resistance of Mofcp and Mofcn). On the other extreme, if Rfxp and Rfxn are set to zero (i.e. short circuits), then none of the current flows through, and none of the current is modulated by, Mofcp and Mofcn. In that case, the amplitude of the correctable offset voltage is zero, while the AC performance of the equalization stage is at a maximum.

Hence, given the above discussion and finite fixed Rfxp and Rfxn, it is apparent that the differential offset voltages VOFP and VOFN effectively modulate the offset compensation voltages vocn and vocp, where vocn is the voltage at the source of M1, and vocp is the voltage at the source of M2. These offset compensation voltages vocn and vocp cause corresponding voltage changes in the differential voltage outputs (OUTP and OUTN), and these differential voltage outputs are provided as the differential voltage inputs of the next stage (Eq2).

As further shown in FIG. 4, a non-dominant pole (Non-dominant pole A) is created by the source follower circuits. (This is the same Non-dominant pole A as in FIG. 3.) In one implementation of the circuit, Non-dominant pole A is at a frequency of approximately 5 to 6 GHz with minimal power consumption (about 100 microamperes). The frequency of Non-dominant pole A is substantially higher (by orders of magnitude) than the frequencies of the parasitic poles shown in FIG. 1. As such, Non-dominant pole A may be neglected for phase margin analysis.

Note that, in the embodiment of FIG. 4, the NMOS transistors Mofcp and Mofcn may be maintained in the linear region by sizing them appropriately and by using the PMOS level shifters (Mlsp and Mlsn configured as source followers). The source follower circuits also serve as fail safes. In particular, the source follower circuits may be configured to ensure that, if the threshold voltages of Mlsp and Mlsn are high, the gate voltages (vsfp and vsfn) applied to Mofcp and Mofcn will still be sufficient to keep them in the linear region.

In accordance with an embodiment of the invention, the offset compensation loop has one secondary pole (at the input of the offset compensation loop) of consequence and one dominant pole. In one embodiment, while the overall loop gain of the circuit 300 in FIG. 3 may be about 10 dB less than the overall loop gain of the circuit 100 in FIG. 1, the circuit 300 of FIG. 3 has greater offset cancellation ability since it uses the whole tail current, which can be large. In addition, the reduced loop gain of the circuit 300 in FIG. 3 makes it easier to stabilize the loop. Furthermore, without multiple parasitic poles, variations in process, voltage and temperature (PVT) have less detrimental effects on stability.

Figure 5:
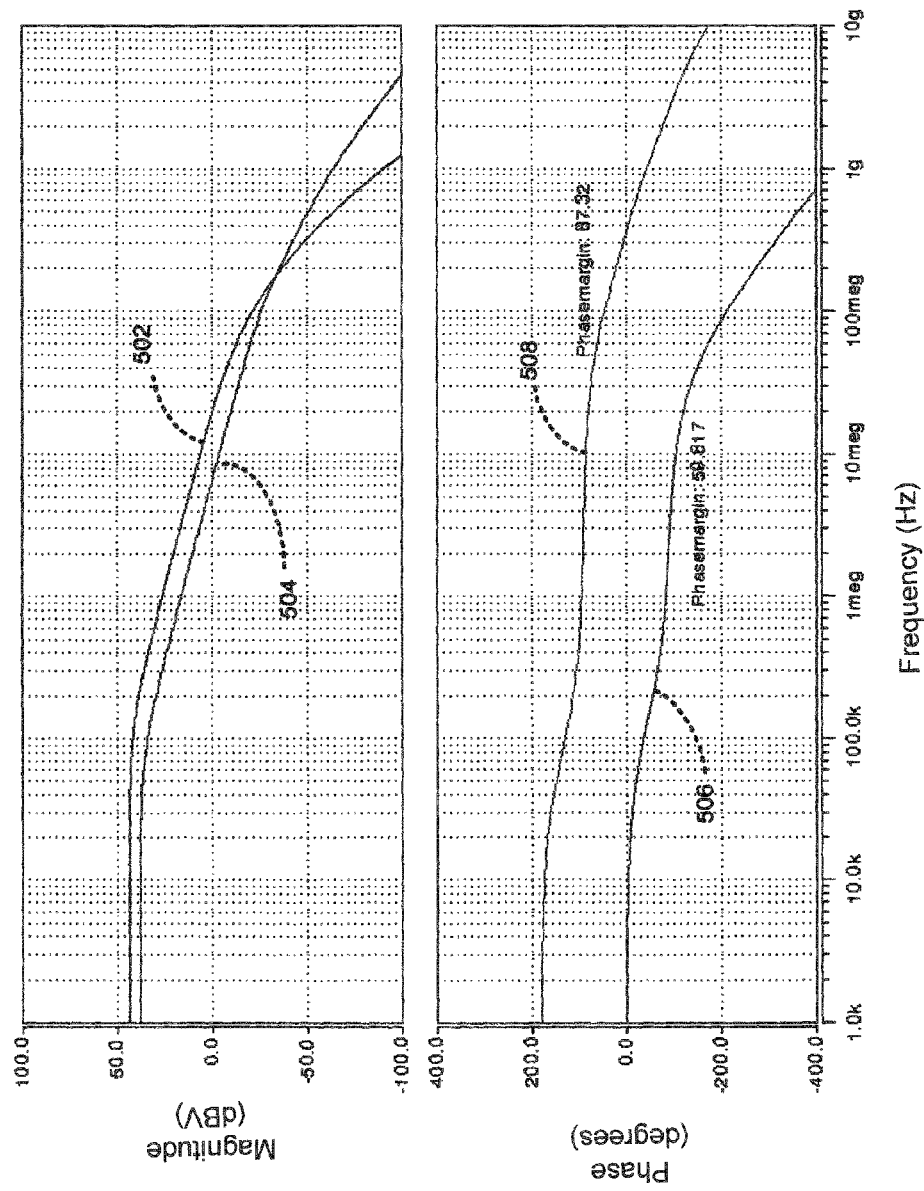
FIG. 5 is a Bode plot providing a comparison between the conventional offset cancellation loop of FIG. 1 and the offset cancellation loop of FIG. 3 in accordance with an embodiment of the invention.

FIG. 5 is a Bode plot providing a comparison between the conventional offset cancellation loop 100 of FIG. 1 and the offset cancellation loop 300 of FIG. 3 in accordance with an embodiment of the invention. The Bode plot shows magnitude (in dB) and phase (in degrees) versus frequency (in Hz) for the conventional and new loops. In generating the Bode plot, the offset cancellation loop 300 of FIG. 3 was implemented with a similar loop filter size as the conventional offset cancellation loop 100 of FIG. 1.

A first Bode magnitude plot 502 shows the loop gain for the conventional offset cancellation loop 100 of FIG. 1, and a second Bode magnitude plot 504 shows the loop gain for the offset cancellation loop 300 of FIG. 3. A first Bode phase plot 506 shows the frequency-response phase shift of the conventional offset cancellation loop 100 of FIG. 1, and a second Bode phase plot 508 shows the frequency-response phase shift of the conventional offset cancellation loop 300 of FIG. 1.

As seen in the magnitude plots, the 0 dB frequency is higher for the conventional offset cancellation loop 100 than for the offset cancellation loop 300 of FIG. 3. However, as seen in the phase plots, the conventional offset cancellation loop 100 of FIG. 1 has a $4^{th}$-order roll-off beyond 100 MHz, while the offset cancellation loop 300 of FIG. 3 has a less-steep $2^{nd}$-order roll-off beyond 300 MHz. As such, the phase shift plot begins to bend at much lower frequencies for the conventional offset cancellation loop 100 of FIG. 1 (which begins to bend at around 5 MHz) than for the offset cancellation loop 300 of FIG. 3 (which begins to bend at around 20 MHz).

It turns out that, for this particular simulation corner, the phase margin improvement is about 27 degrees (the difference between the phase margin of about 60 degrees for the loop of FIG. 1 and the phase margin of about 87 degrees for the loop of FIG. 3). This indicates that the offset cancellation loop 300 of FIG. 3 is substantially more stable than the conventional offset cancellation loop 100 of FIG. 1. In other words, the offset cancellation loop 300 of FIG. 3 can tolerate a substantially greater open loop phase shift (or time delay) before becoming unstable. In other simulation corners, the parasitic poles in the loop 100 of FIG. 1 may make that loop unstable. The fewer poles in the loop 300 FIG. 3 also makes loop stability easier to manage for a given filter size.

The Bode plot of FIG. 5 shows that a phase margin of greater than 80 degrees is achievable with a similar area for the loop filter of FIG. 3 (as compared with the area for the loop filter of FIG. 1). However, if a lower phase margin may be tolerated (for example, 60 degrees), then the area for the loop filter of FIG. 3 may be reduced (as compared with the area for the loop filter of FIG. 1) while maintaining the same stability.

Figure 6:
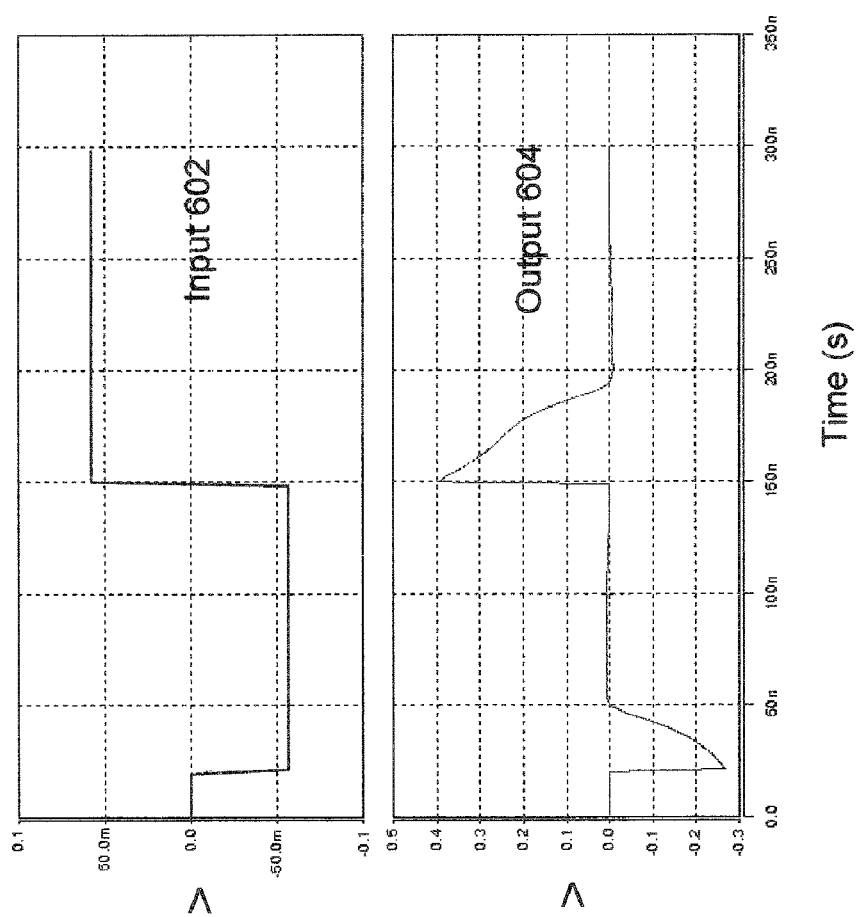
FIG. 6 shows the transient response of the offset compensation loop in accordance with an embodiment of the invention.

FIG. 6 shows the transient response of the offset compensation loop 300 in accordance with an embodiment of the invention. The top graph shows an input signal 602 that starts at 0 volts at time t=0, steps down to negative 60 millivolts near time t=20 ns, then steps up to positive 60 millivolts near time t=150 ns. The bottom graph shows the output signal 604 which is responsive to the DC offset voltages of the input signal 602. In particular, referring to FIG. 3, the input signal 602 corresponds to the voltage of input signal $I_{OFF\_IN}$, and the output signal 604 corresponds to the voltage signal $V_{OFF\_OUT}$. As seen, it takes approximately 50 nanoseconds for the loop 300 to compensate for each voltage step in the input signal. As further seen in FIG. 6, there is a residual offset of about +1 mV for the −60 mV input step and a residual offset of about −1 mV for the +60 mV input step.

Figure 7:
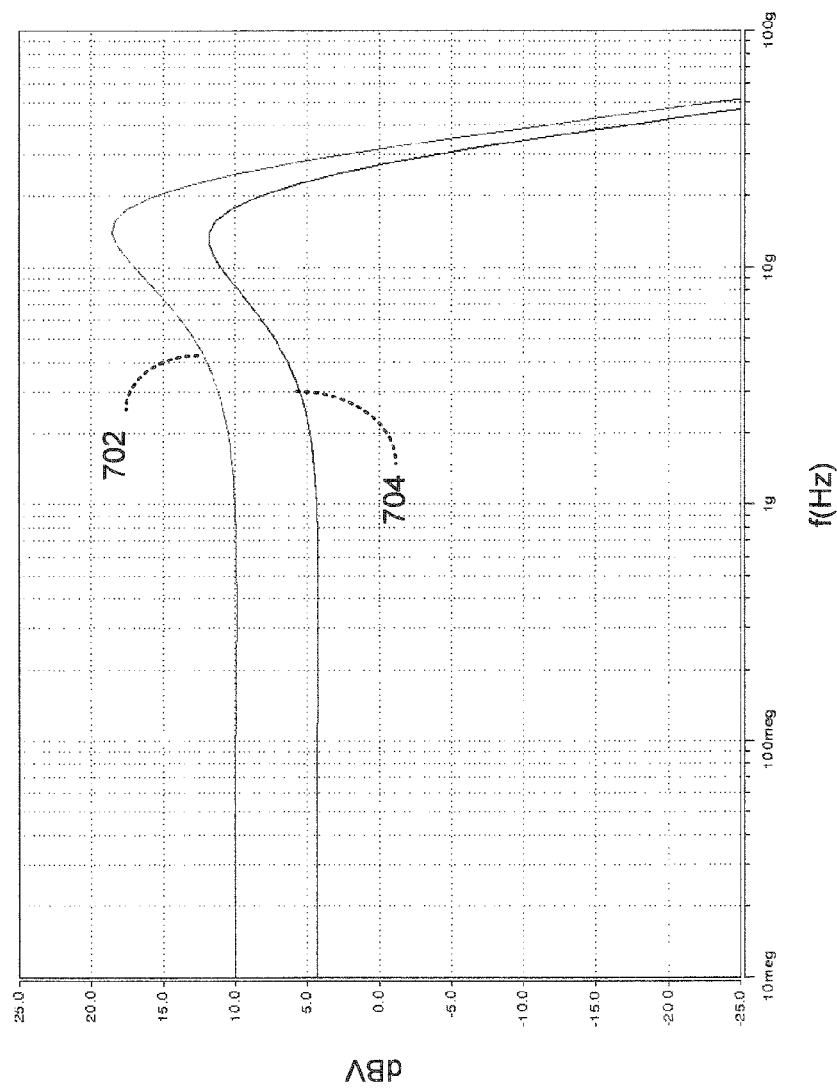
FIG. 7 compares the forward gain of the conventional offset cancellation loop and the offset cancellation loop in accordance with an embodiment of the invention.

FIG. 7 shows the forward gain 702 of the conventional offset cancellation loop 100 of FIG. 1 and the forward gain 704 of the offset cancellation loop 300 of FIG. 3 in accordance with an embodiment of the invention. As seen, the forward gain curve is lower overall for the offset cancellation loop 300 of FIG. 3. Applicants believe that this is because adding the transistors Mofcp and Mofcn decreases the effective gain of the first stage. A slight degradation in effective gm also causes a lowering in peaking frequency and overall bandwidth. Hence, in order to compensate for this degradation in the gain of the stage that would otherwise occur, the DC gain may need to be increased.

Figure 8:
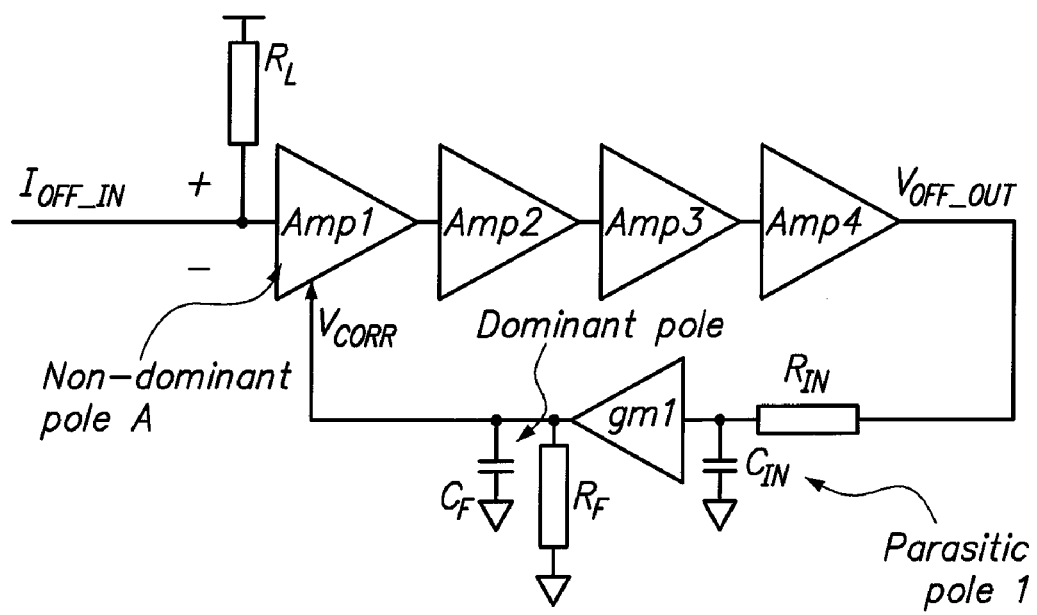
FIG. 8 shows a circuit for offset cancellation of a continuous-time circuit comprising a chain of amplifiers in accordance with an embodiment of the invention.

FIG. 8 shows a circuit 800 for offset cancellation of a continuous-time circuit comprising a circuit of cascaded amplifiers in accordance with an embodiment of the invention. This circuit 800 is similar to the circuit 300 in FIG. 3. The difference is that the chain of equalizer stages (Eq1, Eq2, Eq3, and Eq4) is replaced by a more general chain of amplifier stages (Amp1, Amp2, Amp3, and Amp4). In accordance with an embodiment of the invention, the first amplifier stage (Amp1) may be implemented as shown in FIG. 4.

Figure 9:
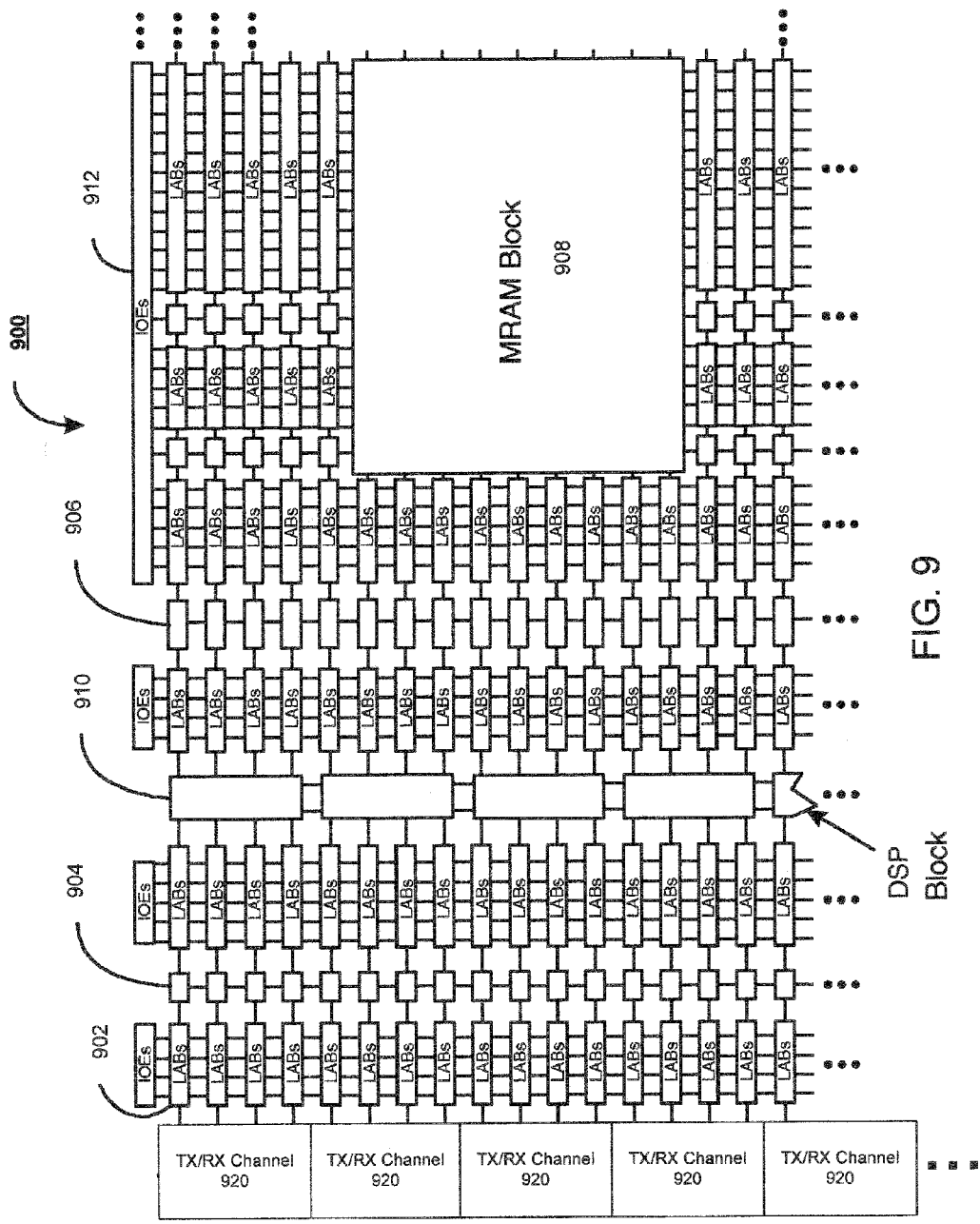
FIG. 9 is a simplified partial block diagram of a field programmable gate array (FPGA) that may be configured to implement an embodiment of the present invention.

FIG. 9 is a simplified partial block diagram of a field programmable gate array (FPGA) 900 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 900 includes within its "core" a two-dimensional array of programmable logic array blocks (or LABs) 902 that are interconnected by a network of column and row interconnect conductors of varying length and speed. LABs 902 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 900 may also include a distributed memory structure including random access memory (RAM) blocks of varying sizes provided throughout the array. The RAM blocks include, for example, blocks 904, blocks 906, and block 908. These memory blocks can also include shift registers and FIFO buffers.

FPGA 900 may further include digital signal processing (DSP) blocks 910 that can implement, for example, multipliers with add or subtract features. Input/output elements (IOEs) 912 located, in this example, around the periphery of the chip support numerous single-ended and differential input/output standards. Each IOE 912 is coupled to an external terminal (i.e., a pin) of FPGA 900. A transceiver (TX/RX) channel array may be arranged as shown, for example, with each TX/RX channel circuit 920 being coupled to several LABs. A TX/RX channel circuit 920 may include, among other circuitry, the offset cancellation circuitry described herein.

It is to be understood that FPGA 900 is described herein for illustrative purposes only and that the present invention can be implemented in many different types of PLDs, FPGAs, and ASICs.

Figure 10:
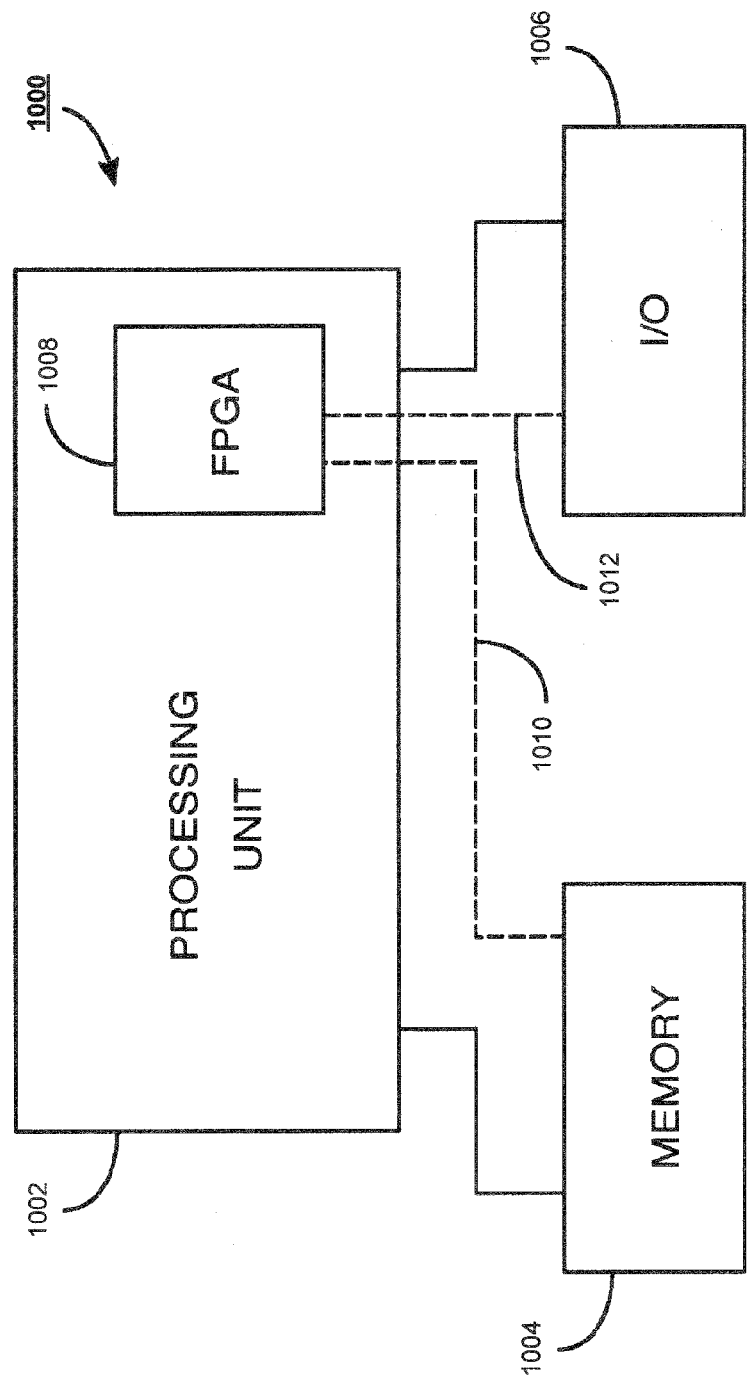
FIG. 10 shows a block diagram of an exemplary digital system that may be configured to utilize an embodiment of the present invention.

The present invention can also be implemented in a system that has a FPGA as one of several components. FIG. 10 shows a block diagram of an exemplary digital system 1000 that can embody techniques of the present invention. System 1000 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 may be provided on a single board, on multiple boards, or within multiple enclosures.

System 1000 includes a processing unit 1002, a memory unit 1004, and an input/output (I/O) unit 1006 interconnected together by one or more buses. According to this exemplary embodiment, FPGA 1008 is embedded in processing unit 1002. FPGA 1008 can serve many different purposes within the system 1000. FPGA 1008 can, for example, be a logical building block of processing unit 1002, supporting its internal and external operations. FPGA 1008 is programmed to implement the logical functions necessary to carry on its particular role in system operation. FPGA 1008 can be specially coupled to memory 1004 through connection 1010 and to I/O unit 1006 through connection 1012.

Processing unit 1002 may direct data to an appropriate system component for processing or storage, execute a program stored in memory 1004, receive and transmit data via I/O unit 1006, or other similar function. Processing unit 1002 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 may control the logical operations of the system. As another example, FPGA 1008 acts as a reconfigurable processor that may be reprogrammed as needed to handle a particular computing task. Alternately, FPGA 1008 may itself include an embedded microprocessor. Memory unit 1004 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A circuit comprising:
   a multi-stage amplifier chain, including a first amplifier stage and a last amplifier stage in the chain;
   an offset cancellation loop configured to receive an output of the last amplifier stage and to provide an offset correction voltage signal to the first amplifier stage;
   an input transistor in the first amplifier stage, the input transistor having a gate, source and drain, wherein the gate of the input transistor is configured to receive an input signal; and
   an offset compensation transistor in the first amplifier stage, the offset compensation transistor having a gate, source, and drain, wherein the drain of the offset compensation transistor is electrically connected to the source of the input transistor, and a voltage on the gate of the offset compensation transistor is determined by the offset correction voltage signal.

2. The circuit of claim 1, further comprising:
   a resistor configured in parallel with a channel of the offset compensation transistor, wherein one end of the resistor is electrically coupled to the source of the offset compensation transistor, and another end of the resistor is electrically coupled to the drain of the offset compensation transistor.

3. The circuit of claim 2, further comprising:
   an impedance which is electrically coupled to the source of the offset compensation transistor; and
   a tail current source which is electrically coupled to the source of the offset compensation transistor.

4. The circuit of claim 3, further comprising:
   a source follower circuit in the first amplifier stage, the source follower circuit being configured to receive the offset correction voltage signal and generate a buffered voltage that is applied as the voltage on the gate of the offset compensation transistor.

5. The circuit of claim 4, wherein the source follower circuit comprises a current source and an offset input transistor having a gate, source and drain, wherein the offset correction voltage signal is applied to the gate of the offset input transistor, and wherein the buffered voltage is generated at a node between the current source and the source of the offset input transistor.

6. The circuit of claim 1, wherein the offset cancellation loop comprises a single transconductance amplifier which outputs the offset cancellation voltage signal.

7. The circuit of claim 6, wherein the offset cancellation loop further comprises:
   a low-pass filter configured to receive the output of the last amplifier stage and to provide a filtered output to an input of the transconductance amplifier.

8. The circuit of claim 6, wherein the offset cancellation loop further comprises:
   a feedback load coupled to an output of the transconductance amplifier.

9. The circuit of claim 8, wherein the feedback load comprises a feedback resistor and a feedback capacitor which both have one end electrically connected to the output of the transconductance amplifier and another end electrically connected to ground.

10. A circuit comprising:
    a multi-stage amplifier chain, including a first amplifier stage and a last amplifier stage in the chain; and
    an offset cancellation loop configured to receive an output of the last amplifier stage and to provide an offset correction voltage signal to the first amplifier stage,
    wherein
    the input signal comprises a differential input signal,
    the input transistor is one of a pair of input transistors configured to receive the differential input signal,
    the offset correction voltage signal comprises a differential offset correction voltage signal, and
    the offset compensation transistor is one of a pair of offset compensation transistors.

11. The circuit of claim 1, wherein the multi-stage amplifier chain comprises a multi-stage equalizer chain, and the first and last amplifier stages comprise first and last equalizer stages, respectively.

12. The circuit of claim 1, wherein the offset compensation loop creates one dominant pole and a single consequential parasitic pole.

13. The circuit of claim 1, wherein the offset compensation loop has a second-order roll-off in response magnitude at higher frequencies.

14. An integrated circuit comprising:
    a cascaded circuit having multiple equalizer stages, including a first equalizer stage and a last equalizer stage, the first equalizer stage being configured to receive a differential input signal, and the last equalizer stage being configured to output a differential output signal;
    an offset cancellation loop configured to receive the differential output signal and to generate a differential offset correction voltage signal which is applied within the first equalizer stage;
    a pair of input transistors in the first equalizer stage, wherein gates of the input transistors are configured to receive the differential input signal;
    a pair of offset compensation transistors in the first equalizer stage, wherein a drain of each offset compensation transistor is electrically connected to a source of a corresponding input transistor, and voltages applied to the gates of the offset compensation transistors are determined by the differential offset correction voltage signal; and
    a pair of resistors, each said resistor being configured in parallel with a channel of a corresponding offset compensation transistor.

15. The integrated circuit of claim 14, further comprising:
    an impedance which is electrically coupled to the source of the offset compensation transistor; and
    a tail current source which is electrically coupled to the source of the offset compensation transistor.

16. The integrated circuit of claim 15, further comprising:
    a source follower circuit in the first amplifier stage, the source follower circuit being configured to receive the offset correction voltage signal and generate a buffered voltage that is applied as the voltage on the gate of the offset compensation transistor.

17. The integrated circuit of claim 16, wherein the source follower circuit comprises a current source and an offset input transistor having a gate, source and drain, wherein the offset correction voltage signal is applied to the gate of the offset input transistor, and wherein the buffered voltage is generated at a node between the current source and the source of the offset input transistor.

18. The integrated circuit of claim 14, wherein the offset cancellation loop comprises a single transconductance amplifier which outputs the offset cancellation voltage signal.

19. The integrated circuit of claim 18, wherein the offset cancellation loop further comprises:

a low-pass filter configured to receive the output of the last amplifier stage and to provide a filtered output to an input of the transconductance amplifier.

20. The integrated circuit of claim 18, wherein the offset cancellation loop further comprises:

a feedback load coupled to an output of the transconductance amplifier.

* * * * *